United States Patent
Hung et al.

(10) Patent No.: US 6,386,139 B1
(45) Date of Patent: May 14, 2002

(54) WAFER LOAD/UNLOAD APPARATUS FOR E-GUN EVAPORATION PROCESS

(75) Inventors: Sheng-Feng Hung, Taipei; Hua-Jen Tseng, Chu Pei; Chun-Chieh Lee, Hsinchu; Gwo-Yuh Yang, Tainan Hsien, all of (TW)

(73) Assignee: Mosel Vitelic Inc., Hsin-chu (TW)

( * ) Notice: Subject to any disclaimer, the term of this patent is extended or adjusted under 35 U.S.C. 154(b) by 0 days.

(21) Appl. No.: 09/390,319

(22) Filed: Sep. 7, 1999

(30) Foreign Application Priority Data

Aug. 12, 1999 (TW) ........................................ 88113833 A

(51) Int. Cl.⁷ .............................................. C23C 16/00
(52) U.S. Cl. .................. 118/723 EB; 118/728; 118/500; 118/503; 118/504; 118/505; 118/723 VE
(58) Field of Search ......................... 118/723 EB, 728, 118/500, 503, 504, 505, 723 VE

*Primary Examiner*—Jeffrie R. Lund
(74) *Attorney, Agent, or Firm*—Powell Goldstein Frazer & Murphy

(57) ABSTRACT

A wafer load/unload apparatus used to load/unload the wafer into/from the clamp ring for performing the E-Gun evaporation process is disclosed. The apparatus comprises a base, a central cylinder and a plurality of peripheral cylinders. The base has an even upper surface, and the central cylinder and the plurality of the peripheral cylinders are connected to the upper surface of the base respectively, wherein the plurality of the peripheral cylinders are located around the central cylinders. A recessed trench penetrating through sidewalls of the central cylinder is formed on a top surface of the central cylinder. The central cylinder can penetrate through a clamp ring, wherein the clamp ring is used to load a wafer for performing the E-Gun evaporating process. The spacing distances between the plurality of peripheral cylinders and the central cylinder are bigger than the width of the clamp ring. The plurality of peripheral cylinders are used to prevent the wafer which is placed on the top surface of the central cylinder from falling down.

17 Claims, 3 Drawing Sheets

WAFER LOAD/UNLOAD APPARATUS FOR E-GUN EVAPORATION PROCESS

RELATED APPLICATION

This application claims priority from Taiwan Application No. 88113833, filed Aug. 12, 1999, which is incorporated herein by reference.

FIELD OF THE INTERVENTION

The present invention relates to an apparatus used in the E-Gun evaporating process, and more specifically, to a wafer loading/unloading apparatus for loading/unloading the wafer into/from the clamp ring of the E-gun evaporator.

BACKGROUND OF THE INVENTION

In the semiconductor manufacturing industry, the electron beam evaporation (E-Gun evaporation) technique is widely used and was developed to overcome several known problems in the deposition of the aluminum layer, the nickel layer, the silver layer and other metal materials. This system provides several advantages over known technology. First, the evaporation process has a faster rate to deposit the required metal films. Second, the damage occurring on the wafer surface are not severe after performing the evaporating steps because the collision energy of the metal atoms is lower in the evaporating procedure. In addition, the incorporation of other gases into the deposited films can be prevent effectively because the evaporating procedure is usually done in a vacuum environment. Thus, the purity of the deposited metal films can be promoted considerably. Except for the released thermal energy from the condensation of the deposited films, only the heat radiation from the evaporating source will cause the temperature of the wafer to rise in performing the evaporating procedure. Therefore, the temperature of the wafer can be controlled accurately by using the evaporation process to form the metal films.

Referring to FIG. 1, the reactive chamber 10 of the electron-gun evaporator (E-Gun) for depositing metal films on the backside of the wafer is illustrated. Three planetary fixtures 20 with dish shapes are mounted on the chamber 10 for holding the wafers to perform the evaporating procedure. The shafts 28 and the edges of the planetary fixtures 20 are guided and rolled on the first circle rail 24 and the second circle rail 22 respectively. Namely, the planetary fixtures 20 can be rolled along the first circle rail 24 and the second circle rail 22 during the evaporating procedure. Besides, as shown in FIG. 1, the wafers can be mounted and fixed on the apertures 26 on the planetary fixtures 20 for depositing metal films onto the backsides of the wafers.

In general, the evaporating source (not shown in FIG. 1) is placed in a refractory crucible, and the refractory crucible is located on the bottom of the chamber 10. Then, the evaporating source is heated by the electron beam until the temperature is raised to the melting point of the evaporating source. The solid source will be evaporated to form the evaporating source atoms, and are deposited on the surface of the wafers above the source to form the metal films. The planetary fixtures 20 will be rotated along the directions of the central vertical axis 15, and the wafers (not shown in FIG. 1) mounted on the planetary fixtures 20 will be rolled along the directions of the shafts 28 of the planetary fixtures 20. Thus, the films formed on the wafer will have a uniform thickness.

Referring to FIG. 2, the method of mounting the wafer 34 onto the planetary fixtures 20 is illustrated. The wafer 34 is put into a clamp ring 30 first, and a top lid 32 is used to cover the wafer 34 and the clamp ring 30. Then, the clamp ring 30 is mounted into the aperture 26 on the planetary fixture 20 to perform the evaporating procedure. It is noted that the clamp ring 30 has a concave shape, and a hole 36 is formed on the central portion of the clamp ring 30 for exposing the backside of the wafer 34.

Referring to FIG. 3, however, it is not convenient to load the wafer 34 into the concave shaped clamp ring 30 by using a vacuum chucking pen 38 to transit the wafer 34. As shown in FIG. 3, the vacuum chucking pen 38 is tilted firstly at an angle to make the wafer 34 which is held by the vacuum chucking pen 38 in contact with the clamp ring 30. Then, the operator uses fingers to touch and shift the wafer 34 slightly into the clamp ring 30, and until then take the vacuum chucking pen 38 out of the clamp ring 30.

Similarly, after the evaporating procedure is performed, the vacuum chucking pen 38 cannot contact and suck directly the front side (upper surface) of the wafer 34 because there are various devices manufactured on the front side of the wafer 34. Thus the operator will usually have to touch the backside of the wafer 34 from the hole 36 (as shown in 10 FIG. 2) of the clamp ring 30 and prop up the wafer 34 to make the edge portion of the wafer 34 out of the clamp ring 30. Then the vacuum chucking, pen 38 is stretched into the clamp ring 30 for sucking the backside of the wafer 34. Alternatively, the whole clamp ring 30 can also be overturned to let the wafer 34 pour down for unloading the wafer 34 out of the clamp ring 30.

However, whether propping up the wafer 34 by fingers to unload the wafer 34 from the clamp ring 30 or turning the clamp ring 30 upside down to pour down the wafer 34, the wafer 34 usually suffers from the damage such as being cracked or scratched, and this causes a considerable decrease in the yield and performance of the product. So there is still a requirement to have a wafer load/unload apparatus for loading the wafer into the clamp ring or unloading the wafer out of the clamp ring.

SUMMARY OF THE INVENTION

The object of the present invention is to provide a wafer load/unload apparatus for loading the wafer into the clamp ring for performing the evaporating procedure and for unloading the wafer after the evaporating procedure is done.

A wafer load/unload apparatus used to load/unload the wafer into/from the clamp ring for performing the E-Gun evaporation process is disclosed in the present invention. The apparatus comprises a base, a central cylinder and a plurality of peripheral cylinders. The base has an even upper surface, the central cylinder is connected to the upper surface of the base, and the plurality of the peripheral cylinders are connected to the upper surface of the base and are located around the central cylinder. A recessed trench penetrating through sidewalls of the central cylinder is formed on a top surface of the central cylinder. It is noted that the central cylinder can penetrate through a clamp ring, wherein the clamp ring is used to load a wafer for performing the E-Gun evaporating process. The spacing distances between the plurality of peripheral cylinders and the central cylinder are bigger than the width of the clamp ring. The plurality of peripheral cylinders are used to prevent the wafer placed on the top surface of the central cylinder from falling down. It is noted that when loading the wafer into the clamp ring, the clamp ring is first moved downward to hoop the central cylinder and is placed on the upper surface of the base. A vacuum chucking pen attached on a lower surface of the wafer for loading the wafer is then stretched into the recessed trench to transit the wafer onto the top surface of the central cylinder. The clamp ring is next moved upwards to load the wafer which is placed on the top surface of the central cylinder, after the vacuum chucking pen is removed. When unloading the wafer from the clamp ring, the clamp ring containing the wafer is moved downward to hoop the central cylinder and is placed on the upper surface of the base to remain the wafer on the top surface of the central cylinder.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2:
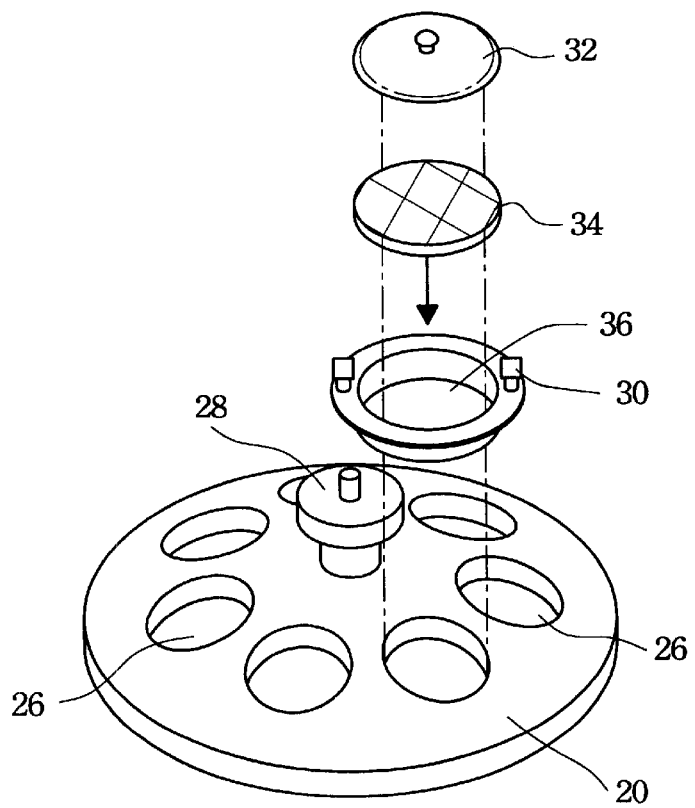
FIG. 2 is a lateral view of the planetary fixture illustrating the steps of placing the wafer into the clamp ring and mounting the clamp ring onto the planetary fixture.
Figure 3:
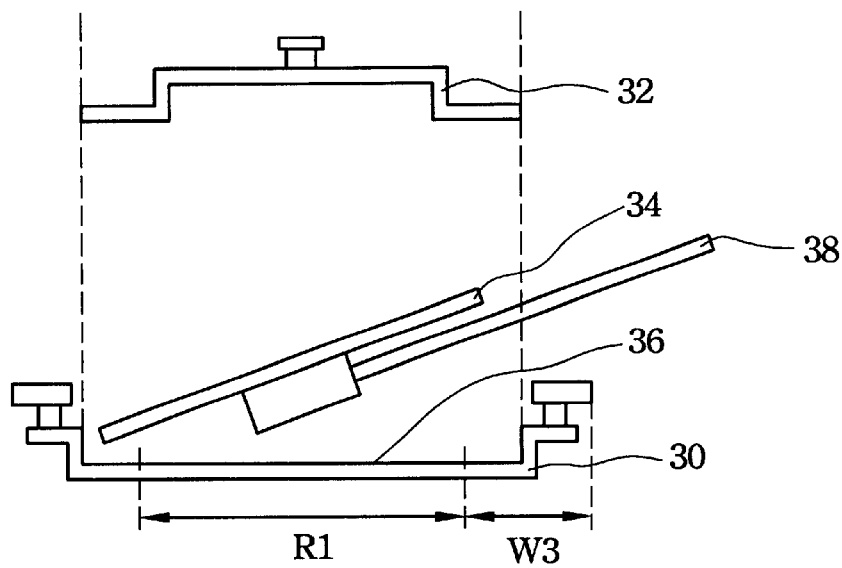
FIG. 3 is a lateral view of the clamp ring illustrating the steps of loading/unloading the wafers into/out of the clamp ring using a vacuum chucking pen to transit the wafer.
Figure 4:
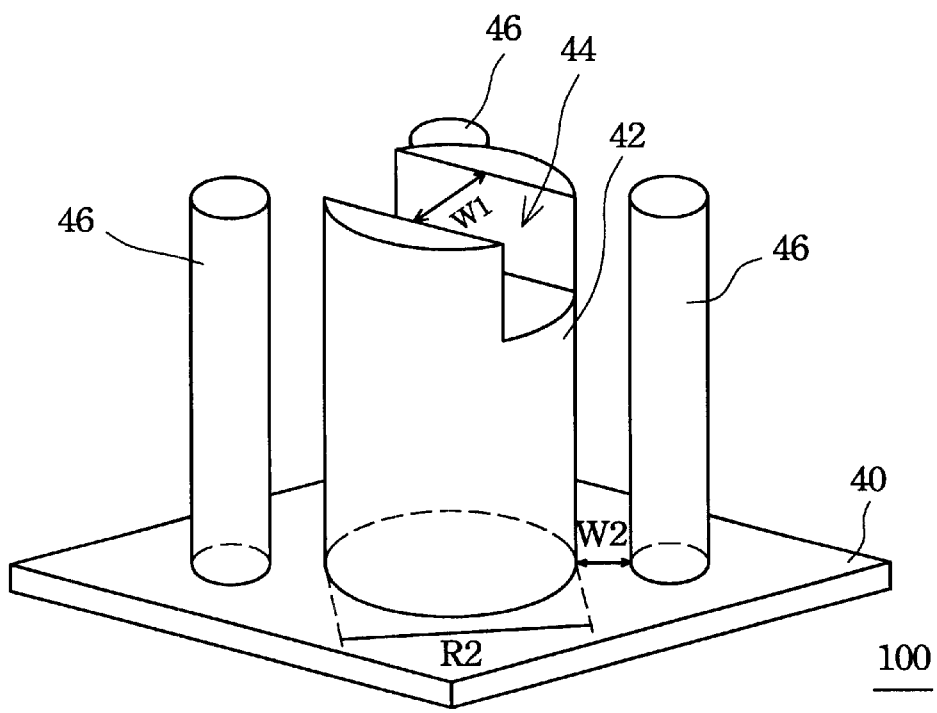
FIG. 4 is a lateral view of the wafer load/unload apparatus provided by the present invention.

A new wafer load/unload apparatus used for loading the wafer into the clamp ring or unloading the wafer from the clamp ring is disclosed in the present invention, wherein the clamp ring is used to contain and hold the wafer for exposing the backside surface of the wafer to form the required films on the backside surface of the wafer by performing the electron beam (E-Gun) evaporation process. The above issues of using a vacuum chucking pen to load/unload the wafer into/from the clamp ring can be resolved effectively by using the apparatus proposed in the present invention. The detailed description is as follows:

Referring to FIG. 4, the wafer load/unload apparatus 100 provided by the present invention is illustrated. As described above, the wafer load/unload apparatus 100 is the tool to load or unload the wafer 34 (as shown in FIG. 2) into or out of the clamp ring 30 for performing the E-Gun evaporating procedure. The wafer load/unload apparatus 100 comprises an even base 40 and a central pillar 42, wherein the central pillar 42 is connected to the central portion of the upper surface of the base 40. In a preferred embodiment, a central cylinder 42 can serve as the central pillar 42. In addition, a recessed trench 44 penetrating through the sidewalls of the central cylinder 42 is formed on a top surface of the central cylinder 42. It is noted that the width $W_1$ of the recessed trench 44 is determined to allow the vacuum chucking pen 38 (referring to FIG. 3) to stretch into the recessed trench 44 from the opening of the sidewall of the central cylinder 42.

Besides, the size of the central cylinder 42 is determined to allow the central cylinder 42 to penetrate through the clamp ring 30 from the hole 36 (as shown in FIG. 2). Namely, the diameter $R_2$ of the cross section of the central cylinder 42 is determined to be bigger than the inner diameter $R_1$ (namely the diameter of the hole 36 of the clamp ring 30) of the clamp ring 30. Thus, the clamp ring 30 can be moved downward to hoop the central cylinder 42 and be placed on the upper surface of the base 40.

Still referring to FIG. 4, a plurality of peripheral pillars 46 are connected to the upper surface of the base 40 and are located around the central cylinder 42. It is noted that the spacing distance $W_2$ between each peripheral pillar 46 and the central cylinder 42 is bigger than the width $W_3$ of the clamp ring 30. And in an embodiment, each peripheral pillar 46 is higher than the central cylinder 42 in order to prevent the wafer that is placed on the top surface of the central cylinder 42 from falling down. Besides, the clamp ring 30 can be used to hoop the central cylinder 42 and can be placed downwards onto the base 40, and will not collide with any peripheral pillar 46 around the central cylinder 42. In a preferred embodiment, three peripheral cylinders are located uniformly around the central cylinder 42 on the base 40 to serve as the peripheral pillars 46.

Figure 5:
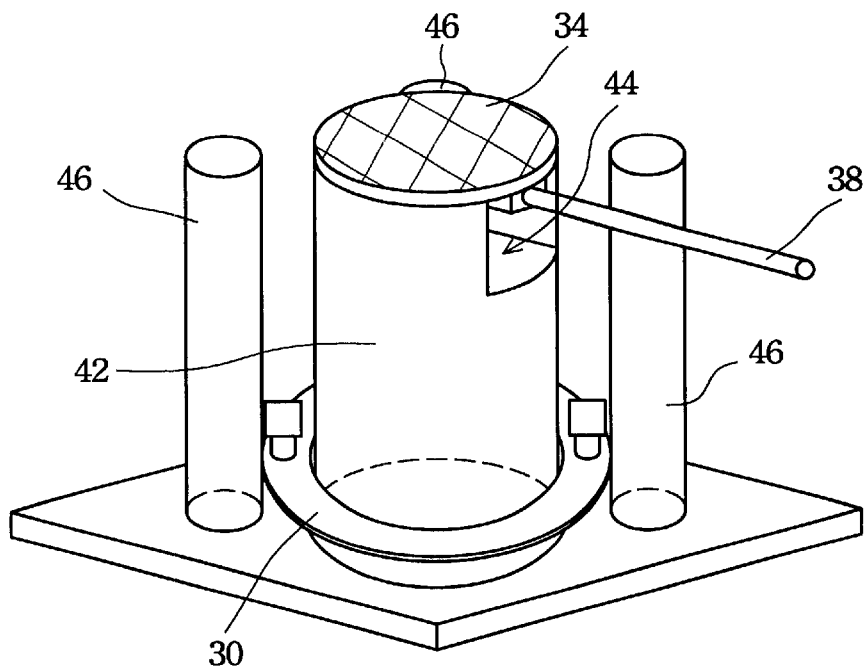
FIG. 5 is a lateral view of the wafer load/unload apparatus according to the present invention illustrating the steps of loading/unloading the wafer into/out of the clamp ring.

As described above, in FIG. 2, before performing the evaporating procedure, the wafer 34 is placed into the clamp ring 30 and, the top lid 32 is covered onto the wafer 34 and the clamp ring 30. Referring to FIG. 5, when loading the wafer 34 into the clamp ring 30, the clamp ring 30 is used to hoop the central cylinder 42 and is placed downwards onto the upper surface of the base 40. Then, a vacuum chucking pen 38 on which the wafer 34 is sucked and held is then stretched into the recessed trench 44 for transiting the wafer 34 onto the top surface of the central cylinder 42. Next, the vacuum chucking pen 38 is removed from the recessed trench 44, and the wafer 34 remains on the top surface of the central cylinder 42.

Figure 1:
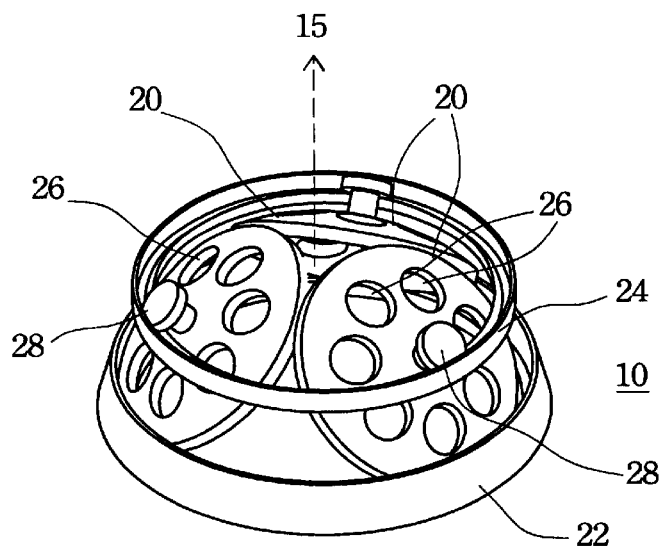
FIG. 1 illustrates the lateral view of the reactive chamber of the E-Gun evaporator using for performing the evaporating process.
Figure 6:
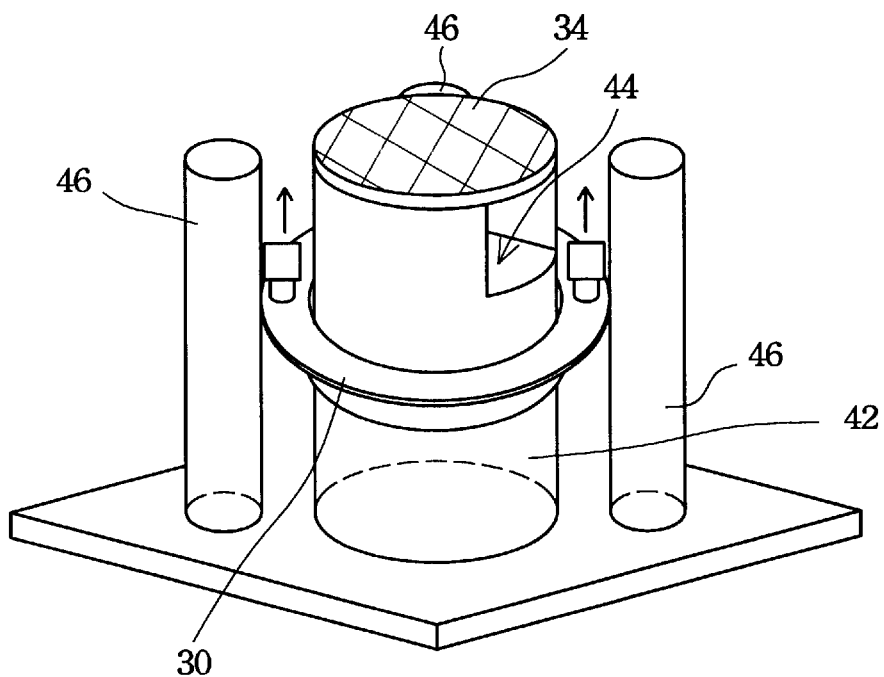
FIG. 6 is a lateral view of the wafer load/unload apparatus according to the present invention illustrating the steps of loading/unloading the wafer into/out of the clamp ring.

Then, referring to FIG. 6, the clamp ring 30 is moved upwards along the central cylinder 42 to load the wafer 34 which remains on the top surface of the central cylinder 42. Thus, the wafer 34 is loaded into the clamp ring 30. Then, as described above, the top lid 32 (shown in FIG. 2) is covered onto the clamp ring 30 and the wafer 34, and the whole clamp ring 30 is mounted onto the planetary fixture 20. Other wafers are loaded into the clamp rings respectively in the same manner, and the clamp rings are mounted onto the planetary fixture 20 in sequence. Next, as shown in FIG. 1, the planetary fixtures are placed in the reactive chamber 10 to perform the E-Gun evaporation process.

Similarly, after the evaporation process is performed, the wafer 34 also can be unloaded from the clamp ring 30 (as shown in FIG. 4) using the wafer load/unload apparatus 100 provided by the present invention. The clamp ring 30 which contains the wafer 34 is moved downwards to hoop the central cylinder 42 and is placed on the upper surface of the base 40 in order to remain just the wafer 34 still on the top surface of the central cylinder 42. It is noted that the clamp ring 30 can be moved downward directly to hoop the central cylinder 42 and can be placed on the base 40 due to the inner diameter $R_1$ of the clamp ring 30 being bigger than the diameter $R_2$ of the central cylinder 42. Next, the vacuum chucking pen 38 is stretched into the recessed trench 44 from the opening of the sidewall of the central cylinder 42 to contact and suck the backside of the wafer 34 for holding the wafer 34. Thus, the wafer 34 can be transited by the vacuum chucking pen 38 in order to perform the next required process.

It is noted that the peripheral pillars 46 are not limited to the cylinder shape. And any kind of stick, pin, or branch can be used to serve as the peripheral pillars 46 in the present invention. Besides, the peripheral pillars 46 are not only used to prevent the wafer 34 which is placed on the top surface of the central cylinder 42 from falling down, the peripheral pillars 46 are also used to mark the direction and deposition of the wafer 34 in the clamp ring 30. In a preferred embodiment, the mark edge of the wafer 34 which is placed on the central cylinder 42 can be aligned to a designated peripheral pillar 46, and the mark portion of the clamp ring 30 is also aligned to the designated peripheral pillar 46. Then, when the clamp ring 30 is moved upwards to load the wafer 34 on the central cylinder 42, the direction of the wafer 34 can be determined and defined by the clamp ring 30. It is beneficial to perform the later required processes.

As can be appreciated from the above disclosure, the present invention provides the following advantages. First, by using the wafer load/unload apparatus provided in the present invention to load/unload the wafer into/from the clamp ring for performing the evaporation procedure, it is not necessary for the operator to touch the wafer for guiding the wafer for loading or unloading the wafer into or out of the clamp ring. Thus, the damage probability (such as crack or scratch) of the wafer can be reduced considerably. Besides, the direction of the wafer can be identified from the clamp ring because the wafer and the clamp ring can be positioned to align to the designated peripheral pillar before loading the wafer into the clamp ring.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A wafer load/unload apparatus used for an E-Gun evaporating process, the apparatus comprising:
   a base having an even upper surface;
   a central pillar having a recessed trench in a top surface thereof, the central pillar being connected to the even upper surface of the base and the central pillar being adapted to penetrate through a clamp ring; and
   at least one peripheral pillar also connected to the even upper surface of the base the, wherein a distance between the peripheral pillar and the central pillar is greater than a width of the clamp ring.

2. The apparatus of claim 1, wherein the central pillar is cylindrical.

3. The apparatus of claim 2, wherein an inner diameter of the clamp ring is greater than a diameter of said central pillar.

4. The apparatus of claim 1, wherein a size of the recessed trench is sufficient to allow a vacuum chucking pen to stretch into the recessed trench.

5. The apparatus of claim 1, wherein the peripheral pillar comprises three separate cylindrical pillars.

6. The apparatus of claim 5, wherein the three cylindrical peripheral pillars are higher than the central pillar.

7. The apparatus of claim 1, wherein the peripheral pillar is used to prevent a wafer placed on the top surface of the central pillar from falling down.

8. The apparatus of claim 7, wherein the peripheral pillar is used to align a mark edge of the wafer for marking a position of the wafer.

9. A wafer load/unload apparatus using for an E-Gun evaporating process, the apparatus comprising:
   a base having an upper surface; and
   a central pillar having a recessed trench in a top surface thereof, wherein the central pillar is connected to the upper surface of the base and the central pillar is adapted to penetrate through a clamp ring.

10. The apparatus of claim 9, further comprising a plurality of peripheral pillars connected to the upper surface of the base and around the central pillar.

11. The apparatus of claim 10, wherein the plurality of peripheral cylinders comprises at least three cylinders.

12. The apparatus of claim 10, wherein each peripheral pillar is higher than the central pillar.

13. The apparatus of claim 10, wherein the plurality of peripheral pillars is used to align a mark edge of the wafer to mark a position of the wafer.

14. The apparatus of claim 9, wherein the upper surface of the base is an even surface.

15. The apparatus of claim 9, wherein a distance between each peripheral pillar and the central pillar is greater than a width of the clamp ring.

16. The apparatus of claim 9, wherein a size of the recessed trench is sufficient to allow a vacuum chucking pen to stretch into the recessed trench.

17. The apparatus of claim 9, wherein an inner diameter of said clamp ring is greater than a width, length or diameter of a cross section of the central pillar.

* * * * *